United States Patent
Kowal

(10) Patent No.: US 11,728,133 B2
(45) Date of Patent: Aug. 15, 2023

(54) RESONATOR, LINEAR ACCELERATOR, AND ION IMPLANTER HAVING ADJUSTABLE PICKUP LOOP

(71) Applicant: Applied Materials, Inc., Santa Clara, CA (US)

(72) Inventor: Keith E. Kowal, Swampscott, MA (US)

(73) Assignee: Applied Materials, Inc., Santa Clara, CA (US)

(*) Notice: Subject to any disclaimer, the term of this patent is extended or adjusted under 35 U.S.C. 154(b) by 96 days.

(21) Appl. No.: 17/513,243

(22) Filed: Oct. 28, 2021

(65) Prior Publication Data
US 2023/0134262 A1    May 4, 2023

(51) Int. Cl.
*H01J 37/00* (2006.01)
*H01J 37/317* (2006.01)
*H01J 37/30* (2006.01)

(52) U.S. Cl.
CPC ...... *H01J 37/3171* (2013.01); *H01J 37/3002* (2013.01); *H01J 2237/04737* (2013.01)

(58) Field of Classification Search
CPC ............... H01J 37/3171; H01J 37/3002; H01J 2237/04737
USPC .......................................... 250/492.1–492.3
See application file for complete search history.

(56) References Cited

U.S. PATENT DOCUMENTS

| | | |
|---|---|---|
| 4,992,744 A | 2/1991 | Fujita |
| 2002/0021118 A1 | 2/2002 | Roberge |
| 2021/0125810 A1 | 4/2021 | Kowal |
| 2021/0307152 A1* | 9/2021 | Kowal .................. H01J 37/24 |

FOREIGN PATENT DOCUMENTS

JP    H11185999 A    7/1999

OTHER PUBLICATIONS

International Search Report and Written Opinion for the International Patent Application No. PCT/US2022/044857, dated Jan. 25, 2023, 6 pages.

\* cited by examiner

*Primary Examiner* — Michael Maskell
(74) *Attorney, Agent, or Firm* — KDW Firm PLLC

(57) ABSTRACT

An apparatus may include an exciter, disposed within a resonance chamber, to generate an RF power signal. The apparatus may include a resonator coil, disposed within the resonance chamber, to receive the RF power signal, and generate an RF output signal; and a pickup loop assembly, to receive the RF output signal and output a pickup voltage signal. The pickup loop assembly may include a pickup loop, disposed within the resonance chamber; and a variable attenuator, disposed at least partially between the resonator coil and the pickup loop. The variable attenuator may include a configurable portion, movable from a first position, attenuating a first amount of the RF output signal, to a second position, attenuating a second amount of the RF output signal, different from the first amount.

20 Claims, 7 Drawing Sheets

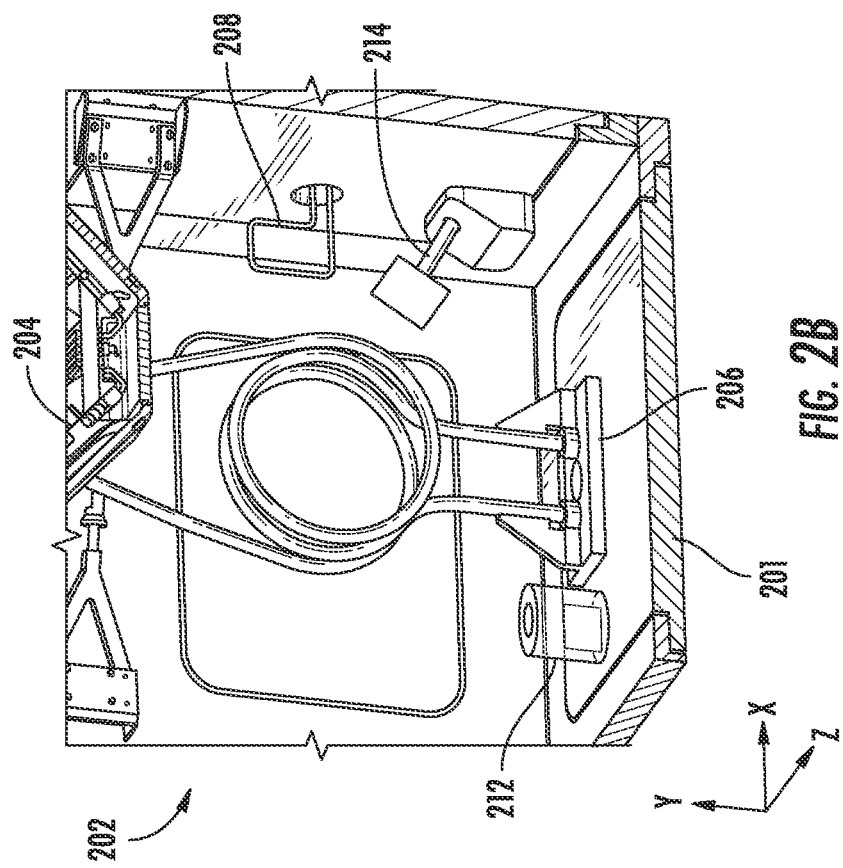
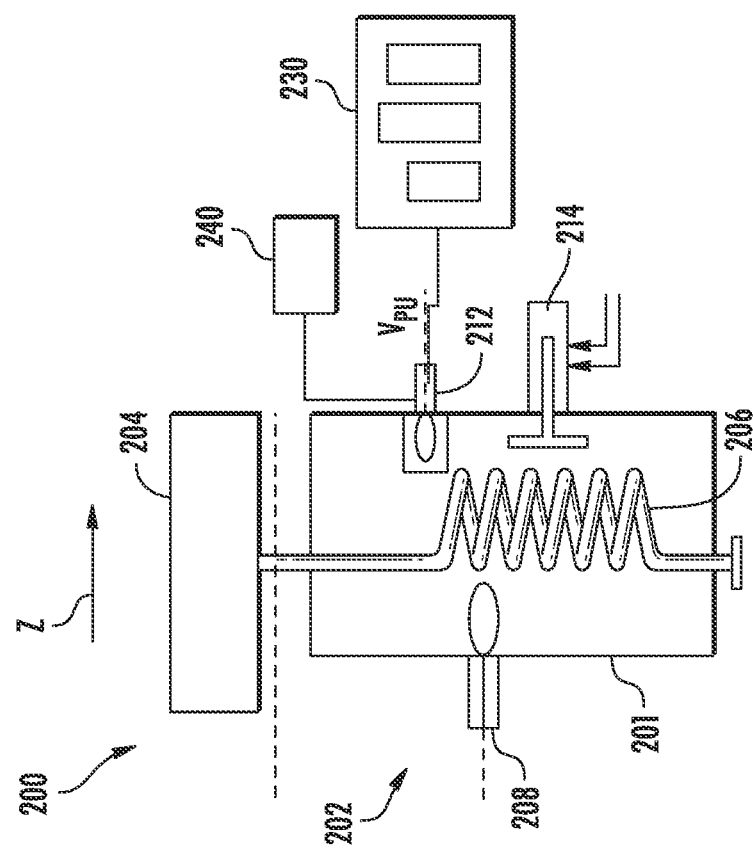

RESONATOR, LINEAR ACCELERATOR, AND ION IMPLANTER HAVING ADJUSTABLE PICKUP LOOP

FIELD OF THE DISCLOSURE

The disclosure relates generally to ion implantation apparatus and more particularly to high energy beamline ion implanters based upon linear accelerators.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. One type of ion implanter suitable for generating ion beams of medium energy and high energy uses a linear accelerator, or LINAC, where a series of AC or RF electrodes arranged as tubes around the beam accelerate the ion beam to increasingly higher energy along the succession of tubes. The various electrodes may be arranged in a series of stages where a given electrode in a given stage receives an AC voltage signal to accelerate the ion beam.

LINACs employ initial stages that bunch an ion beam as the beam is conducted through the beamline. A given stage of the LINAC is used to increase ion energy by accelerating ions using, for example, an RF resonator generating an RF voltage that is applied to a given electrode or set of electrodes at the given stage. The RF voltage generates an oscillating electric field that is coupled into an ion beam being conducted through the LINAC by controlling the phase and amplitude of the RF voltage applied to the given LINAC stage.

A given RF resonator will be tuned to maintain resonance for optimum coupling of RF energy into an ion beam. Because a given RF resonator forms part of an inductor-resistor-capacitor circuit together with the RF electrode that is driven by the RF resonator, known resonators may include a tuning component, such as a capacitor, to adjust tuning of the resonator in order to maintain resonance.

Recently, LINACs that include pickup loops for sensing resonator output have been proposed to aid tuning of resonators. The pickup loop may be formed of an electrical conductor that is placed within a resonance chamber housing the resonator coil. To control resonator operation, control circuitry may be provided to receive a voltage signal from the pickup loop, so that appropriate adjustment to a resonator circuit is performed. During operation of a LINAC, the input at such a pickup loop may vary over a wide range as power into the resonator coil is changed. However, the control circuitry may be overwhelmed under scenarios where the voltage signal output by the pickup loop is above a given voltage threshold. Likewise, under conditions of lower power applied to the resonator coil, the pickup loop may fail to output a usable signal to the control circuitry. Thus, the pickup loop and associated control circuitry may fail to operate properly under certain ranges of power applied to a resonator.

With respect to these and other considerations, the present disclosure is provided.

BRIEF SUMMARY

In one embodiment an apparatus is provided, including an exciter, disposed within a resonance chamber, to generate an RF power signal. The apparatus may include a resonator coil, disposed within the resonance chamber, to receive the RF power signal, and generate an RF output signal; and a pickup loop assembly, to receive the RF output signal and output a pickup voltage signal. The pickup loop assembly may include a pickup loop, disposed within the resonance chamber; and a variable attenuator, disposed at least partially between the resonator coil and the pickup loop. The variable attenuator may include a configurable portion, movable from a first position, attenuating a first amount of the RF output signal, to a second position, attenuating a second amount of the RF output signal, different from the first amount.

In another embodiment, a method of controlling a resonator in a linear accelerator is provided. The method may include generating an RF input signal at an exciter, disposed within a resonance chamber, and generating an RF output signal in a resonator coil, disposed within the resonator chamber, based upon the RF input signal. The method may include detecting the RF output signal at a pickup loop assembly, where the pickup loop assembly includes a variable attenuator, having a configurable portion, and outputting a pickup voltage signal based upon the RF output signal, where the pickup voltage signal has a voltage value within a determined range. The method may further include adjusting a position of the variable attenuator from a first position, attenuating a first amount of the RF output signal, to a second position, attenuating a second amount of the RF output signal, based upon the voltage value.

In another embodiment, an ion implanter may include an ion source to generate an ion beam and a linear accelerator, including at least one acceleration stage to accelerate the ion beam. The at least one acceleration stage may include an exciter, disposed within a resonance chamber, to generate an RF power signal, and a resonator coil, disposed within the resonance chamber, to receive the RF power signal, and generate an RF output signal. The at least one acceleration stage may also include a pickup loop assembly, to receive the RF output signal and output a pickup voltage signal. The pickup loop assembly may have a pickup loop, disposed within the resonance chamber, and a pickup loop container, disposed around the pickup loop, wherein the pickup loop container comprises a conductive shell and an aperture, the conductive shell blocking a first portion of the RF output signal, and the aperture transmitting a second portion of the RF output signal to the pickup loop.

BRIEF DESCRIPTION OF THE DRAWINGS

FIG. 2A illustrates an exemplary acceleration stage in a LINAC, in accordance with various embodiments of the disclosure;

FIG. 2B shows exemplary details of a resonator chamber, according to embodiments of the disclosure;

Figure 1:
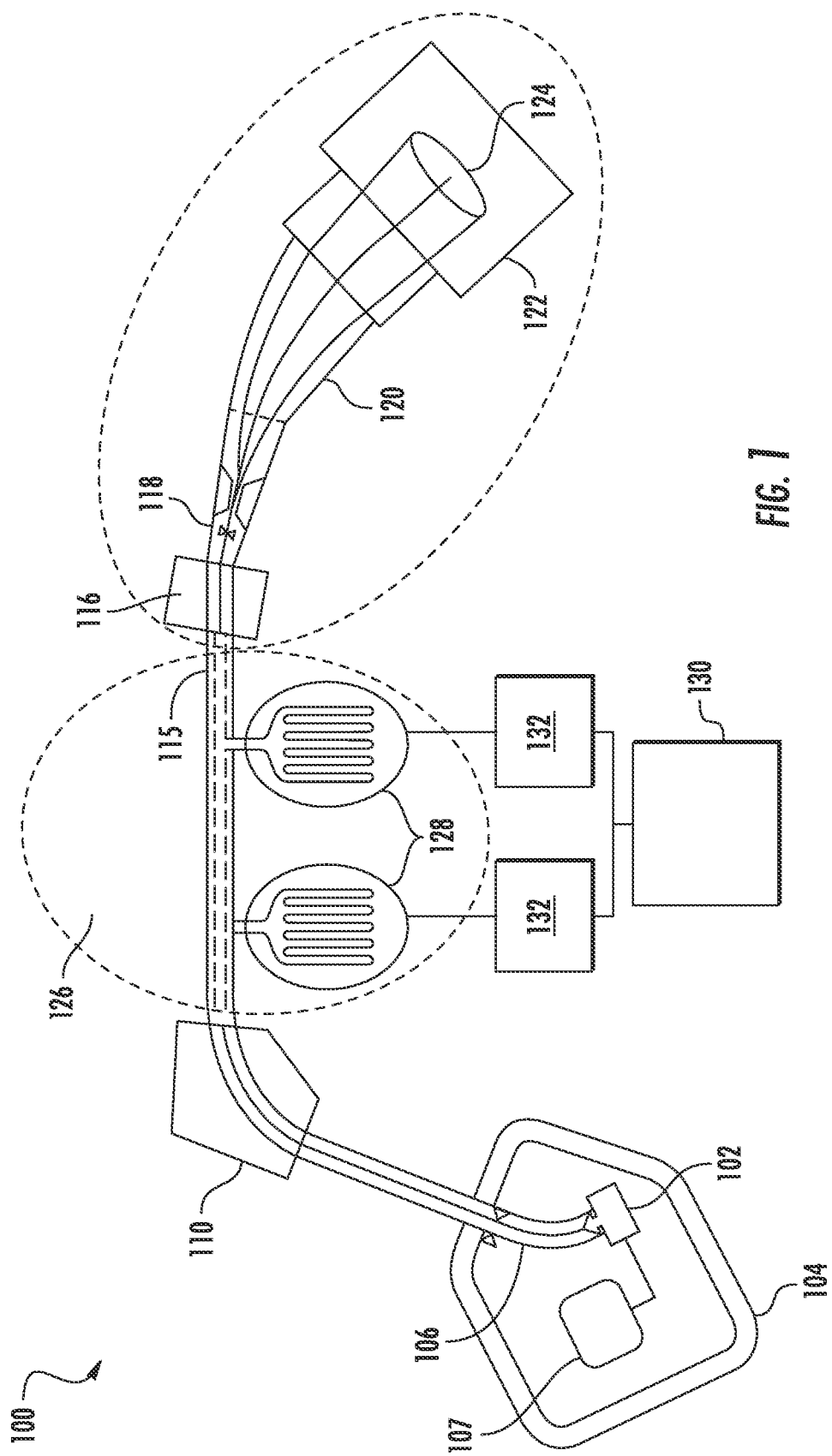
FIG. 1 shows an exemplary ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved linear accelerator control, and improved high energy ion implantation systems, based upon a beamline architecture. For brevity, an ion implantation system may also be referred to herein as an "ion implanter." Various embodiments provide novel configurations for providing the capability of generating high energy ions, where the final ion energy delivered to a substrate may be 300 keV, 500 keV, 1 MeV or greater. In exemplary embodiments, a novel control arrangement and techniques are provided for controlling resonators in a LINAC having multiple stages.

Referring now to FIG. 1A, an exemplary ion implanter, shown as ion implantation system 100, is depicted in block form. The ion implantation system 100 may represent a beamline ion implanter, with some elements omitted for clarity of explanation. The ion implantation system 100 may include an ion source 102, and a gas box 107 held at high voltage as known in the art. The ion source 102 may include extraction components and filters (not shown) to generate an ion beam 106 at a first energy. Examples of suitable ion energy for the first ion energy range from 5 keV to 100 keV, while the embodiments are not limited in this context. To form a high energy ion beam, the ion implantation system 100 includes various additional components for accelerating the ion beam 106.

The ion implantation system 100 may include an analyzer 110, functioning to analyze a received ion beam. Thus, in some embodiments, the analyzer 110 may receive the ion beam 106 with an energy imparted by extraction optics located at the ion source 102, where the ion energy is in the range of 100 keV or below, and in particular, 80 keV or below. In other embodiments, the analyzer 110 may receive the ion beam accelerated by a DC accelerator column to higher energies such as 200 keV, 250 keV, 300 keV, 400 keV, or 500 keV. The embodiments are not limited in this context. The ion implantation system 100 may also include a linear accelerator 126 (shown in the dashed line), disposed downstream of the analyzer 110. The linear accelerator 126 may include a plurality of accelerator stages, arranged in series, as represented by resonators 128. For example, a given stage of the linear accelerator may be driven by a given resonator, generating an AC voltage signal in the MHz range (RF range), where the AC voltage signal generates an AC field at an electrode of the given stage. The AC field acts to accelerate the ion beam, which beam may be delivered to the stages in packets as a bunched ion beam. A buncher, not separately shown, may be located at a first stage of the linear accelerator 126, to receive a continuous ion beam and generate a bunched ion beam by action of an RF resonator at the buncher. The accelerator stages may act similarly to the buncher, to output bunched ion beams at a given stage, and to accelerate the ion beam to a higher energy in stages. Thus, a buncher may be considered to be a first accelerator stage, differing from downstream accelerator stages in that the ion beam is received as a continuous ion beam.

In various embodiments, the ion implantation system 100 may include additional components, such as a filter magnet 116, a scanner 118 and collimator 120, where the general functions of the filter magnet 116, scanner 118 and collimator 120 are well known and will not be described herein in further detail. As such, a high energy ion beam, represented by the high energy ion beam 115, after acceleration by the linear accelerator 114, may be delivered to an end station 122 for processing of a substrate 124.

In various embodiments, a given acceleration stage of the acceleration stages 128 may be coupled to or may include a controller 132, which controller includes circuitry to adjust operation of a pickup loop assembly that is used to control a given resonator used to power that acceleration stage. A general control system, shown as controller 130, may be used to control various additional aspects of the linear accelerator 126.

FIG. 2A illustrates an acceleration stage 200 in a LINAC, in accordance with various embodiments of the disclosure. The acceleration stage 200 includes a resonator chamber 202, to deliver high voltage to a drift tube electrode 204, which electrode may be arranged in a double gap or triple gap drift tube assembly, as known in the art. A resonator coil 206 is disposed in the resonator chamber 202, to receive an RF power signal from an exciter 208. The resonator coil 206 may couple to the exciter 208 via a magnetic field, and may consequently generate an RF output signal at a frequency of the RF power signal. At the upper terminal of the resonator coil 206, the RF output signal will be received as an RF voltage at the drift tube electrode 204. A maximum amplitude of this voltage will depend upon the amplitude of the exciter 208 power. Depending upon the amount of acceleration called for in a given ion implantation process, the voltage maximum at resonance condition may vary from say 1 kV to more than 100 kV. A movable capacitor 214 is also provided for tuning of the resonance circuit formed by the resonator chamber 202 and related circuitry.

To monitor the output of resonator coil 206 the acceleration stage 200 may include a pickup loop assembly 212, as shown in FIG. 2A. As shown in the cut-out perspective view of FIG. 2B, the pickup loop assembly 212 may be located in a suitable region of a resonator chamber wall 201 of the resonator chamber 202. As such, the pickup loop assembly 212 will include a conductor, such as a wire or conductive trace, to sense the RF output signal of resonator coil 206. In operation, the intensity of the RF output signal from resonator coil 206 will vary with the intensity of the RF power signal from exciter 208. Thus, for higher voltage to be generated at the drift tube electrode 204, a higher RF power signal is delivered to the resonator coil 206, resulting in a larger RF output signal that is sensed by the pickup loop assembly 212.

As shown in FIG. 2A, the acceleration stage 200 further includes an LRC [Local resonator controller] controller 230, coupled to receive a pickup signal from the pickup loop assembly 212. The pickup signal may be output as a pickup voltage signal, shown as $V_{PU}$, which signal will vary according to the RF output signal from the resonator coil 206, and may be used by the LRC controller 230 to adjust operation of the acceleration stage, including the RF power signal and phase that is applied by exciter 208. As such, the LRC controller 230 may be coupled to an RF power supply 232 that provides the RF power signal to the exciter 208. The acceleration stage 200 may further include an attenuator controller 240, to control operation of the pickup loop assembly 212, detailed below.

In some non-limiting examples, when the output voltage from the resonator coil 206 is varied from say 1 kV to 100 kV and higher, to the drift tube electrode 204, the resulting amplitude of the voltage of the pickup voltage signal that is output by the pickup loop assembly 212 may vary between tens of mV and up to tens of volts, such as between 0.1V and 15 V. To suitably operate, the LRC controller 230 may best function when the voltage of the pickup voltage signal lies within a given range, such as: a minimum voltage of 0.5 V and maximum voltage of 1.5 V; a minimum voltage of 0.75 V and maximum voltage of 1.25 V, and so forth. Thus, over certain ranges of output voltage to the drift tube electrode 204, such as very low voltage, or very high voltage, the pickup voltage signal output by the pickup loop assembly 212 may not be ideal for handling by the LRC controller 230.

Figure 3B:
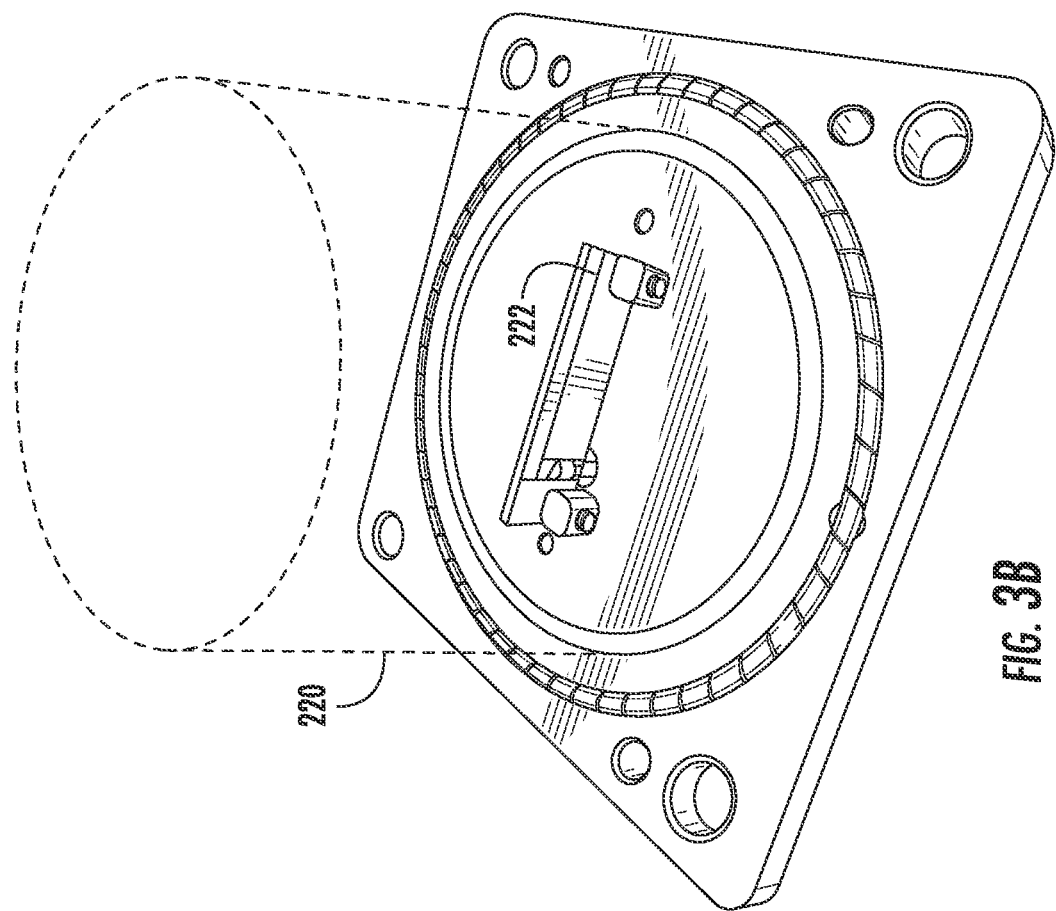
FIG. 3B depicts an exemplary pickup loop assembly according to embodiments of the disclosure.
Figure 3A:
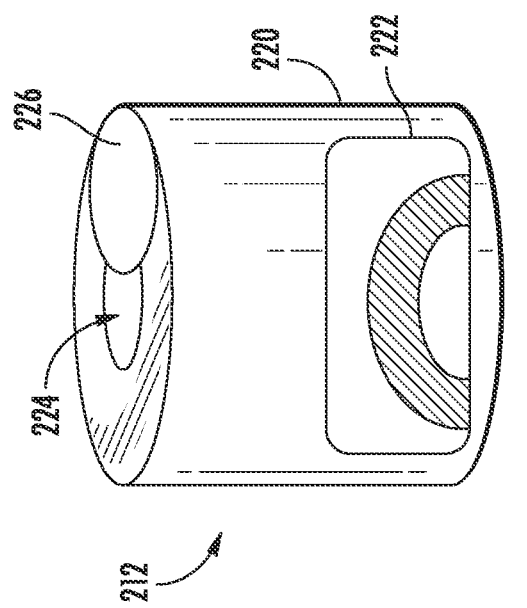
FIG. 3A depicts an exemplary pickup loop assembly according to embodiments of the disclosure.
Figure 4A:
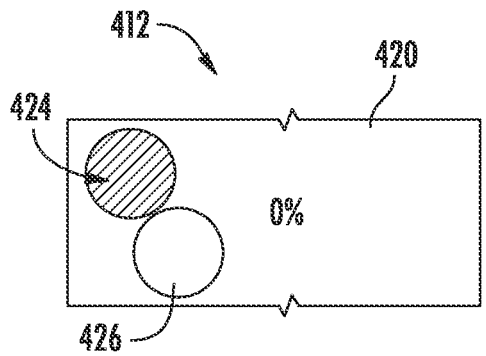
FIGS. 4A-4E depict operation of a variable attenuator for a pickup loop according to some embodiments.
Figure 4B:
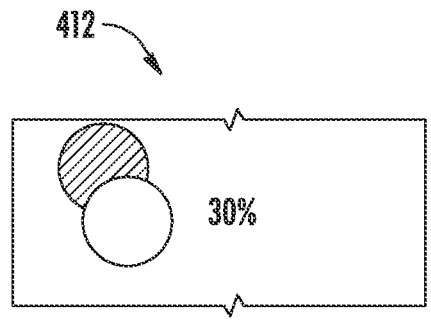
Figure 4C:
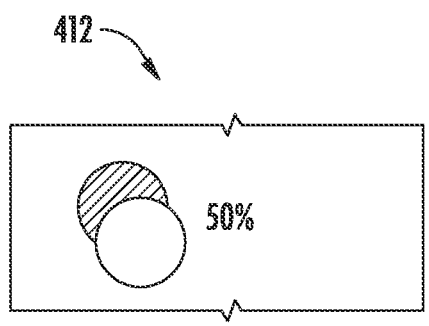
Figure 4D:
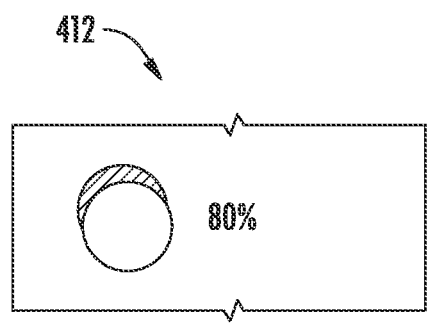
Figure 4E:
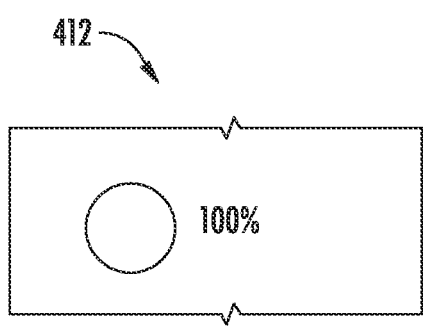
Figure 5D:
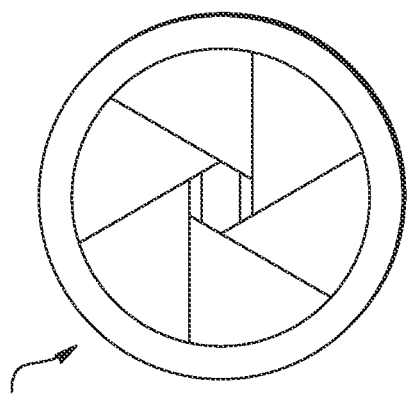
FIGS. 5A-5D depict operation of a variable attenuator for a pickup loop according to some embodiments.
Figure 5C:
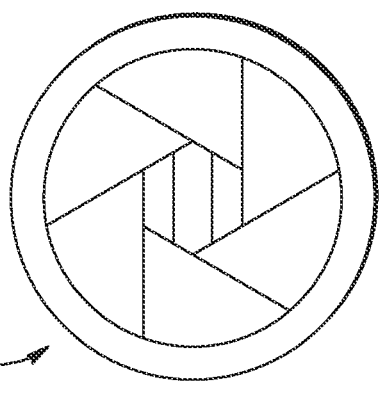
Figure 5B:
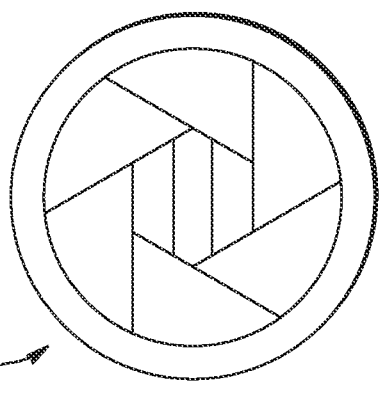
Figure 5A:
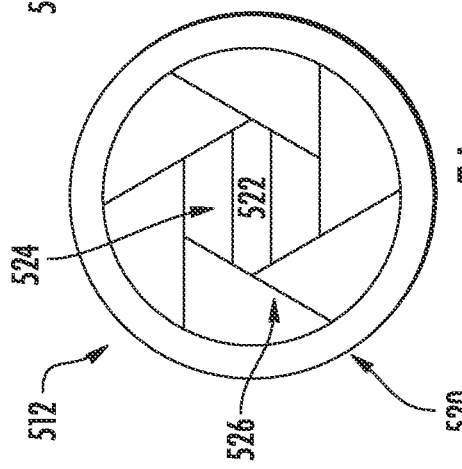

To adjust intensity of voltage signals that are output, the pickup loop assembly 212 may include additional components besides a pickup loop as shown in the following figures. FIG. 3A depicts a variant of the pickup loop assembly 212. In this embodiment, the pickup loop assembly includes a pickup loop 222, which structure may be embodied as a conductive trace in a printed circuit board (PCB) substrate. The pickup loop 222 is surrounded by a pickup loop container 220. The pickup loop container 220 may be an electrical conductor that acts as a shield to block an RF output signal, such as a signal received from the resonator coil 206. As generally shown in FIG. 2B and FIG. 3B, the pickup loop container 220 may extend into the resonator chamber such that the resonator chamber wall 201 forms a base part of the pickup loop container 220.

In order to transmit some RF signal between the resonator coil 206 and the pickup loop 222, the pickup loop container 220 may be provided with an aperture 224 that is disposed between the resonator coil 206 and pickup loop 222. The pickup loop assembly 212 may be adjustable in order to adjust output from the pickup loop 222. For example, the pickup loop assembly 212 may further include a variable attenuator 226, arranged wherein the variable attenuator 226 includes at least one part that is movable so as to change an aperture size of the aperture 224 from a first size to a second size. In some examples, a component of a variable attenuator may be slidable, rotatable, or otherwise movable with respect to an aperture in order to vary the size of the aperture.

In the example of FIG. 3A, the variable attenuator 226 is shown as a disc that may be moved with respect to the aperture 224 so as to cover a lesser or greater portion of the aperture 224. The variable attenuator 226 may likewise comprise an electrically conductive material that is arranged to cover the aperture 224 so that the RF signal from resonator coil 206 that is received by the pickup loop 222 is blocked to a greater or lesser extent according to the extent that the variable attenuator 226 covers the aperture 224. Note that this technique does not introduce any phase error.

According to various embodiments of the disclosure, a variable attenuator may have any suitable combination of parts and mechanisms so as to vary the amount of RF signal transmitted to the pickup loop 222.

FIGS. 4A-4E depict operation of a variable attenuator for a pickup loop assembly, according to some embodiments. In this embodiment, a pickup loop assembly 412 is shown, including a pickup loop container 420 that is represented by the rectangular shape, where a pickup loop may be disposed within the pickup loop container 420. A circular aperture is provided as aperture 424, together with a conductive disc 426 (forming part of a variable attenuator), where the conductive disc 426 may be moved with respect to aperture 424 so as to block more or less part of the aperture 424. In some embodiments, the conductive disc 426 may be coupled to a mechanism, such as a mechanical mechanism, or a motor (not shown) to move the conductive disc 426 with respect to the aperture 424. In the different views of FIGS. 4A-4E, the amount of coverage of the aperture 424 is varied from 0% to 100% to illustrate that the pickup loop assembly may vary the attenuation of an RF signal over a similar range.

FIGS. 5A-5D depict operation of a variable attenuator for a pickup loop assembly 512 according to other embodiments. In this example, a pickup loop 522 is disposed inside a container 520, shown in a top view. An aperture 524 is formed on an outer end of the container 520 using an iris component 526 that acts as part of a variable attenuator. The iris component 526 may have multiple blades that are movable with respect to one another so as to change the size of the aperture 524, as shown in FIGS. 5A-5D.

The above figures are merely exemplary and other suitable components to vary aperture size are possible according to other embodiments of the disclosure. Thus, a variable attenuator of the present embodiments facilitates operation of a resonator control system over a full range of power. In other words, the amount of attenuation of the output power received at a pickup coil may be adjusted so that the pickup voltage signal sent to a controller may be maintained within suitable range regardless of the intensity of the power generated from the resonator coil. Using a variable attenuator according to the present embodiments, may additionally allow for a means to obtain zero voltage output from a pickup loop assembly during calibration of a control system.

According to additional embodiments of the disclosure, a pickup loop assembly may be configured with an enclosure having a fixed aperture to partially enclose a pickup loop. The size of the fixed aperture may be calibrated to provide a targeted voltage output from a pickup loop, given a targeted operating power range for a resonator. For example, a given fixed aperture AP having a given area may be installed to provide a voltage output between 0.75 V and 1.25 V for power range corresponding to 50 kV to 100 KV. Thus, when operating a LINAC acceleration stages to generate 50 kV to 100 kV (but not limited to 100 kV) per acceleration gap, a pickup loop assembly having the fixed aperture AP may be installed to ensure proper operation of a resonator over that voltage range.

Figure 6A:
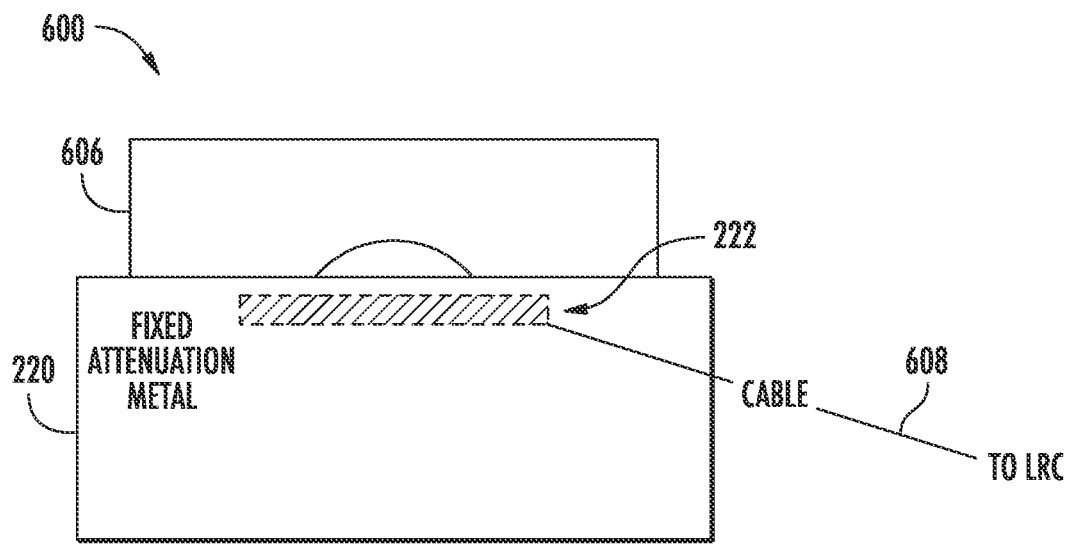
FIG. 6A depicts an exemplary pickup loop assembly according to embodiments of the disclosure.

FIG. 6A depicts an exemplary pickup loop assembly according to embodiments of the disclosure. The pickup loop assembly 600 may include a pickup loop container 220 and pickup loop 222, as well as an attenuator 606, which component may be a fixed attenuator, having an aperture that transmits a portion of RF signals incident on the pickup loop container 220. A cable 608 is provided to connect the pickup loop 222 to a local resonator controller. In operation, the attenuator 606 may be fixed to permit a predetermined size of an aperture to form on a wall of the pickup loop container 220.

Figure 6B:
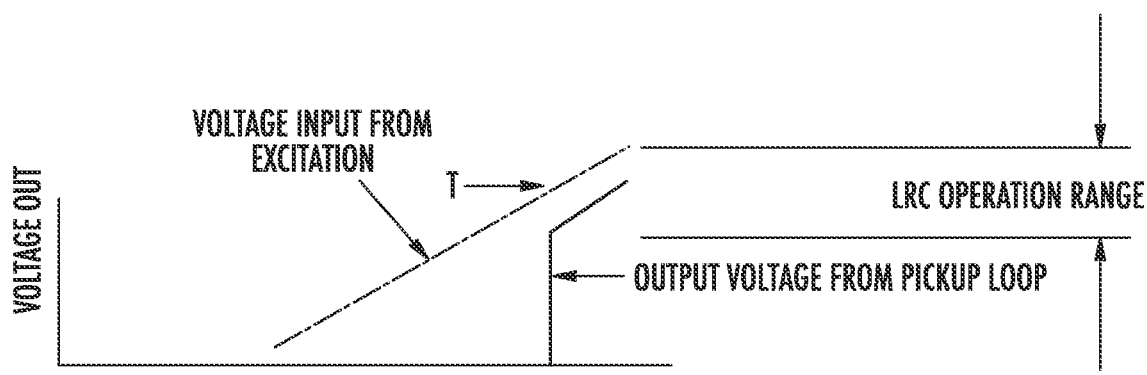
FIG. 6B depicts an exemplary electrical behavior of a resonator, operated in accordance with embodiments of the disclosure.

FIG. 6B depicts an exemplary electrical behavior of a resonator, operated in accordance with embodiments of the disclosure. In this case, the resonator may incorporate a fixed attenuator pickup loop assembly as in FIG. 6A. The graph shown in FIG. 6A illustrates different voltage signals as a function of time. In the scenario shown, the voltage from a power supply that is transmitted to an exciter of a resonator is ramped up as shown in the dashed line. The solid line indicates the voltage signal output by a pickup loop assembly, where the voltage scale may be different between the exciter voltage and the pickup loop voltage. Initially, as voltage is ramped up to the exciter, when the exciter voltage level remains below a threshold T, the resonator coil RF output is not sufficient to generate a voltage signal form the pickup loop. Once the threshold T is reached, the output voltage from the pickup loop jumps to a predetermined value, and then increases with increasing exciter voltage as shown. FIG. 6B further shows an operation voltage range for the LRC controller, according to the voltage output by the pickup coil, such as 0.75 to 1.25 V. Once the threshold voltage of the exciter is exceeded the voltage level of the pickup loop voltage may be such that the LRC controller "sees" this signal and an LRC algorithm or control process is initiated to adjust phase and amplitude of power input to the resonator. Ideally, the pickup loop assembly and fixed attenuator therein may be set so that desired voltage range of input power to the resonator exciter will correspond to a pickup loop voltage that lies within the LRC operational range.

Figure 7:
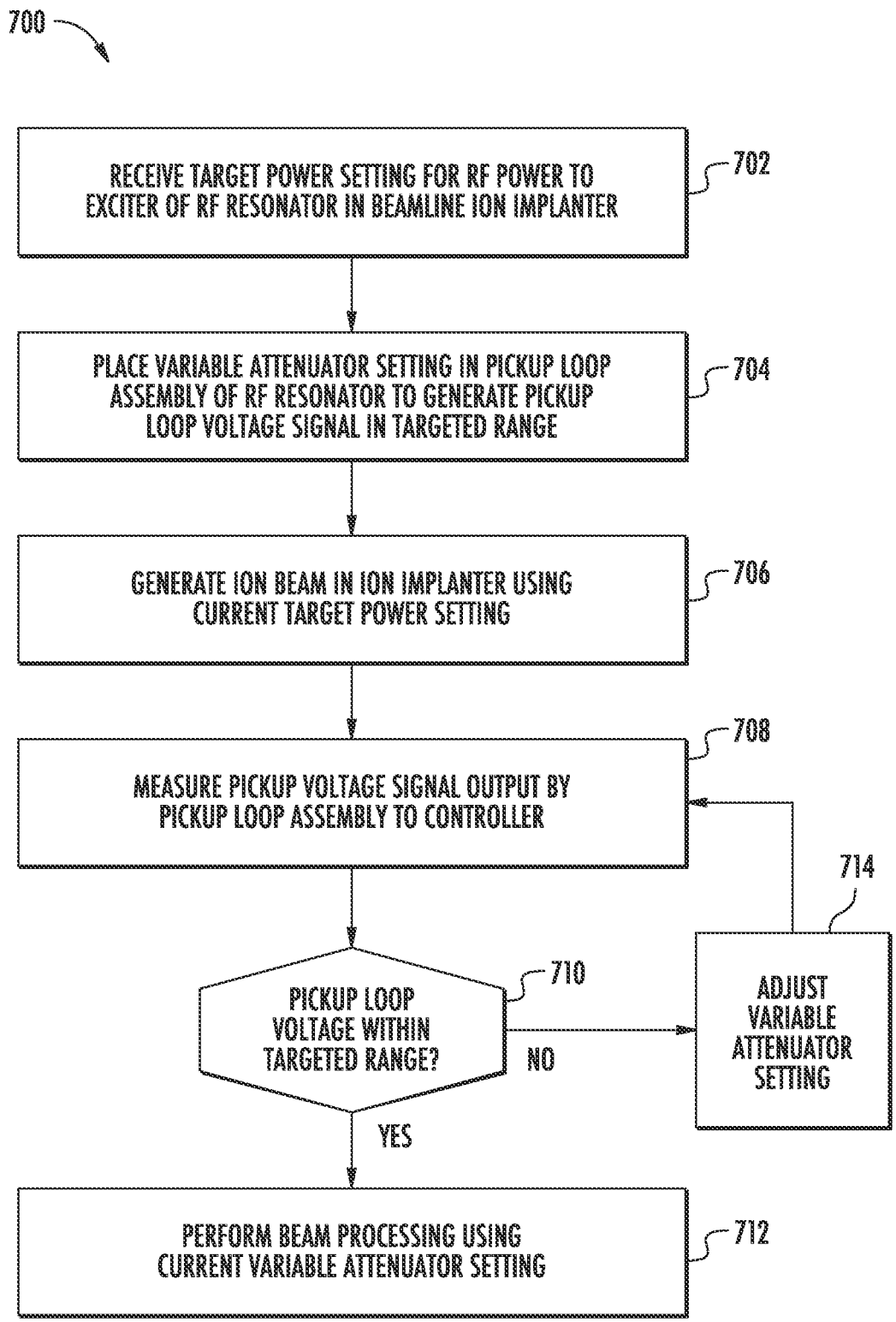
FIG. 7 depicts a process flow, in accordance with embodiments of the disclosure.

FIG. 7 depicts a process flow 700, in accordance with embodiments of the disclosure. At block 702, a target power setting is received for RF power to be applied to an RF resonator in a beamline ion implanter. The target power setting may be set to achieve a targeted accelerating voltage at a set of drift tube electrodes of a linear accelerator powered by the RF resonator.

At block 704, a variable attenuator setting is placed in a pickup loop assembly of the RF resonator, in order to generate a pickup loop voltage signal in a targeted range. For example, a local resonator controller may be configured to receive a pickup loop voltage from the pickup loop assembly in the range of 0.5 vv to 1.5V in order to properly regulate signals sent to the RF resonator. Thus, the variable attenuator setting may correspond to a setting to attenuate an RF output signal that is generated by a resonator coil of the RF resonator in order that a pickup loop coil sense just a portion of the RF output signal, sufficient to generate the targeted range of pickup voltage signal.

At block 706, an ion beam is generated in the ion implanter using a current target power setting at the RF resonator while the ion beam traverses the linear accelerator. As such, the RF resonator may generate an RF signal that is transformed into an RF voltage at a drift tube electrode, and is received as an RF output signal at the pickup coil of the pickup loop assembly.

At block 708, a pickup voltage signal output by the pickup loop assembly to the local resonator controller is measured.

At decision block 710, if the pickup loop voltage of the pickup loop voltage signal is within the targeted range, the flow moves to block 712, where ion beam processing is performed using the current variable attenuator setting. If not in the targeted range the flow moves to block 714, where the variable attenuator setting is adjusted, followed by a return to block 708.

In view of the foregoing, at least the following advantages are achieved by the embodiments disclosed herein. A first advantage is realized by providing a means to minimizes phase and amplitude distortions over a range of power output by a resonator coil. A second advantage is that the installation and/or removal of external cables or other components that could attenuate a signal from a pickup loop are not required.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
    an exciter, disposed within a resonance chamber, to generate an RF power signal;
    a resonator coil, disposed within the resonance chamber, to receive the RF power signal, and generate an RF output signal; and
    a pickup loop assembly, to receive the RF output signal and output a pickup voltage signal, the pickup loop assembly comprising;
    a pickup loop, disposed within the resonance chamber; and
    a variable attenuator, disposed at least partially between the resonator coil and the pickup loop, the variable attenuator comprising a configurable portion, movable from a first position, attenuating a first amount of the RF output signal, to a second position, attenuating a second amount of the RF output signal, different from the first amount.

2. The apparatus of claim 1, the RF output signal comprising a frequency of greater than 1 MHz.

3. The apparatus of claim 1, the pickup loop assembly further comprising:
    a pickup loop container, disposed within the resonance chamber, and surrounding the pickup loop, wherein the pickup loop container comprises a conductor, the conductor blocking the RF output signal, between the resonator coil and the pickup loop.

4. The apparatus of claim 3, wherein the resonator chamber forms a base part of the pickup loop container.

5. The apparatus of claim 3, the pickup loop assembly further comprising:
    an aperture, arranged within the pickup loop container, wherein the variable attenuator comprises at least one part that is movable so as to change an aperture size of the aperture from a first size to a second size.

6. The apparatus of claim 5, wherein the variable attenuator comprises an iris component, arranged to change a diameter of the aperture.

7. The apparatus of claim 5, wherein the variable attenuator comprises a slidable component arranged to move over the aperture.

8. The apparatus of claim 5, wherein the variable attenuator is arranged to move in step fashion between a plurality of discrete positions.

9. The apparatus of claim 1, further comprising a controller, coupled to send an attenuation signal to the variable attenuator to move from the first position to the second position.

10. A method of controlling a resonator in a linear accelerator, comprising:
- generating an RF input signal at an exciter, disposed within a resonance chamber;
- generating an RF output signal in a resonator coil, disposed within the resonator chamber, based upon the RF input signal;
- detecting the RF output signal at a pickup loop assembly, the pickup loop assembly comprising a variable attenuator, having a configurable portion;
- outputting a pickup voltage signal based upon the RF output signal, the pickup voltage signal having a voltage value within a determined range; and
- adjusting a position of the variable attenuator from a first position, attenuating a first amount of the RF output signal, to a second position, attenuating a second amount of the RF output signal, based upon the voltage value.

11. The method of claim 10, the pickup loop assembly further comprising:
- a pickup loop, disposed within a pickup loop container;
- an aperture, arranged within the pickup loop container, wherein the variable attenuator comprises at least one part that is movable so as to change an aperture size of the aperture from a first size to a second size.

12. The method of claim 11, wherein the variable attenuator comprises an iris component, arranged to change a diameter of the aperture.

13. The method of claim 11, wherein the variable attenuator comprises a slidable component arranged to move over the aperture.

14. The method of claim 11, wherein the variable attenuator is arranged to move in step fashion between a plurality of discrete positions.

15. The method of claim 10, wherein the pickup voltage signal is output to an LRC controller, for controlling the RF input signal.

16. An ion implanter, comprising:
an ion source to generate an ion beam; and
a linear accelerator, including at least one acceleration stage to accelerate the ion beam, wherein the at least one acceleration stage comprises:
- an exciter, disposed within a resonance chamber, to generate an RF power signal;
- a resonator coil, disposed within the resonance chamber, to receive the RF power signal, and generate an RF output signal; and
- a pickup loop assembly, to receive the RF output signal and output a pickup voltage signal, the pickup loop assembly comprising;
    - a pickup loop, disposed within the resonance chamber; and
    - a pickup loop container, disposed around the pickup loop, wherein the pickup loop container comprises a conductive shell and an aperture, the conductive shell blocking a first portion of the RF output signal, and the aperture transmitting a second portion of the RF output signal to the pickup loop.

17. The ion implanter of claim 16, comprising:
a variable attenuator, disposed at least partially between the resonator coil and the pickup loop, the variable attenuator comprising a configurable portion, movable from a first position, generating a first aperture size of the aperture, to a second position, generating a second aperture size of the aperture, different from the first aperture size.

18. The ion implanter of claim 17, wherein the variable attenuator comprises an iris component, arranged to change a diameter of the aperture.

19. The ion implanter of claim 17, wherein the variable attenuator comprises a slidable component arranged to move over the aperture.

20. The ion implanter of claim 16, wherein the aperture is a fixed aperture, having a fixed size.

* * * * *